United States Patent [19]

Iijima

[11] Patent Number: 5,331,569
[45] Date of Patent: Jul. 19, 1994

[54] METHOD AND SYSTEM FOR LOGIC CHANGE IN AN AUTOMATIC LOGIC SYNTHESIS SYSTEM

[75] Inventor: Kazuhiko Iijima, Ebina, Japan

[73] Assignee: Hitachi, Ltd., Tokyo, Japan

[21] Appl. No.: 764,576

[22] Filed: Sep. 24, 1991

[30] Foreign Application Priority Data

Sep. 26, 1990 [JP] Japan .................. 2-256407

[51] Int. Cl.$^5$ .............................. G06F 15/60
[52] U.S. Cl. ..................... 364/489; 364/488
[58] Field of Search ............... 364/488, 489, 490, 491; 395/600

[56] References Cited

U.S. PATENT DOCUMENTS

| | | | |
|---|---|---|---|
| 4,703,435 | 10/1987 | Darringer et al. | 364/489 |
| 4,882,690 | 11/1989 | Shinsha et al. | 364/490 |
| 4,964,056 | 10/1990 | Bekki et al. | 364/488 |
| 5,003,487 | 3/1991 | Drumm et al. | 364/489 |
| 5,029,102 | 7/1991 | Drumm et al. | 364/489 |
| 5,041,986 | 8/1991 | Tanishita | 364/489 |
| 5,150,308 | 9/1992 | Hooper et al. | 364/489 |

FOREIGN PATENT DOCUMENTS

62-72070 4/1987 Japan .

Primary Examiner—Vincent N. Trans
Attorney, Agent, or Firm—Pennie & Edmonds

[57] ABSTRACT

An automatic logic synthesis method wherein lower-rank descriptions defining a logic device in terms of expressions of lower abstraction are synthesized from higher-rank descriptions defining the logic device in terms of expressions of higher abstraction, comprising: providing first identifiers each of which indicates the presence of a description change of the corresponding description unit data of the higher-rank description, and providing second identifiers each of which indicates the presence of a description change of the corresponding description unit data of the lower-rank description; setting the first identifier of changed description unit data at the change of the higher-rank description, and setting the second identifier of changed description unit at the change of the lower-rank description directly made without any synthesis process from the higher-rank description; originating new lower-rank description unit data from the higher-rank description unit whose first identifier is set; and registering the new lower-rank description unit data as lower-rank description unit data on condition that the second identifier of the current lower-rank description unit data corresponding to the new lower-rank description unit data is not set, and merging the new lower-rank description unit data and the current lower-rank description unit data and then registering a merged result as lower-rank description unit data on condition that the second identifier of the current lower-rank description unit data is set.

6 Claims, 7 Drawing Sheets

FIG. 1

FUNCTION LOGIC

| MODULE ID | FLAG-1 | FLAG-2 | LOGICAL DESCRIPTION |
|---|---|---|---|
| MODULE 0001 | RESET | RESET | OUT = (IN1·IN2)+(IN3·IN4) |
| MODULE 0002 | RESET | RESET | . . . |
| | | | |
| | | | |

GATE LOGIC

| MODULE ID | FLAG-3 | CELL ID | LOGICAL DESCRIPTION |
|---|---|---|---|
| MODULE 0001 | RESET | CELL 001 | AND . . . |
| | | CELL 002 | AND . . . |
| | | CELL 003 | OR . . . |
| MODULE 0002 | RESET | CELL 004 | . . . |
| | | CELL 005 | . . . |
| | | CELL 006 | . . . |
| | | CELL 007 | . . . |
| | | | |

FIG. 2
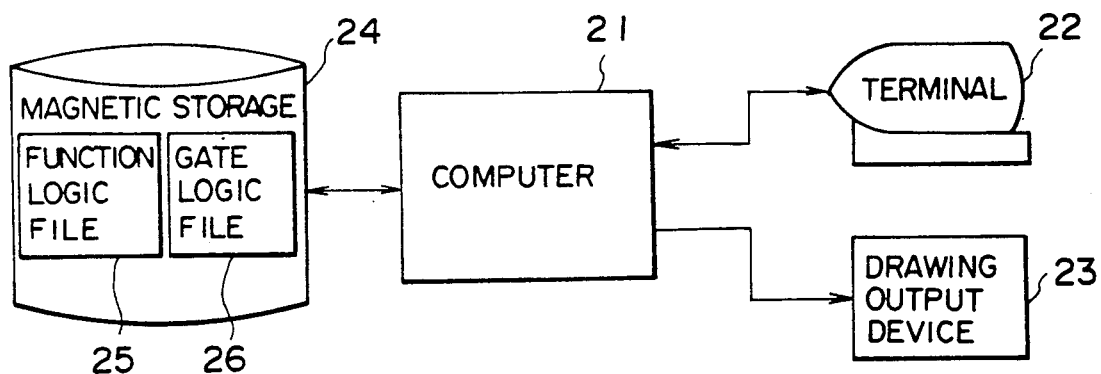
FIG. 3
(a)
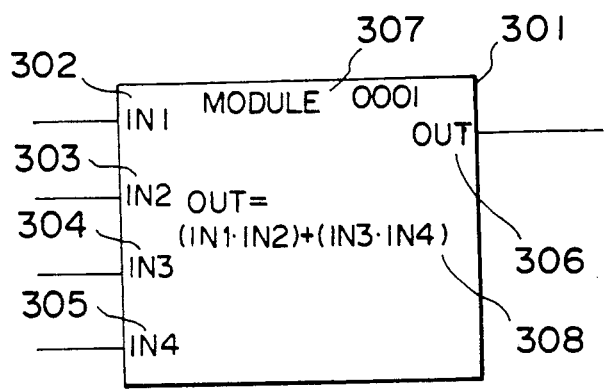
(b)
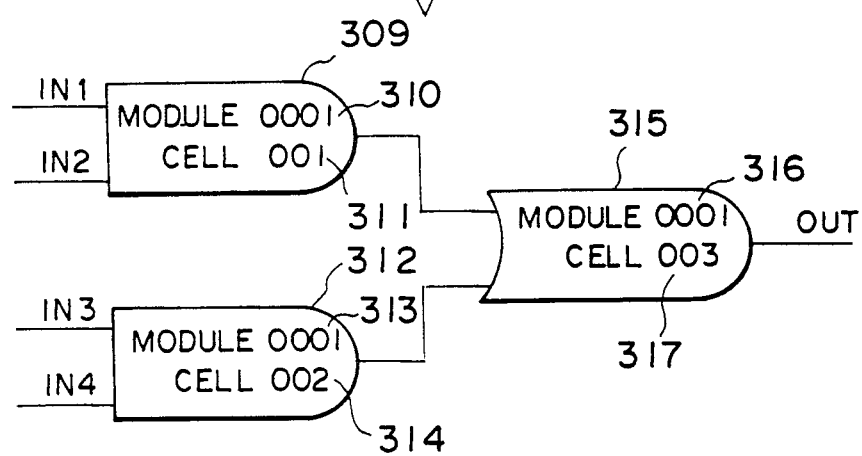

METHOD AND SYSTEM FOR LOGIC CHANGE IN AN AUTOMATIC LOGIC SYNTHESIS SYSTEM

BACKGROUND OF THE INVENTION

1. Field of the Invention

The present invention relates to the design automation of logic devices, and more particularly to techniques for a logic change process in the design automation.

2. Description of the Related Art

In general, in the automatic design of a logic device, gate logic descriptions which define the logic device in terms of expressions of lower abstraction are automatically synthesized from function logic descriptions which define the logic device in terms of expressions of higher abstraction.

In such an automatic logic device design, a design change at the level of function logic is sometimes made after the origination of the gate logic descriptions has been followed by the addition of information (for example, cell placement information for an LSI) as required for the design. In such a case, the automatic logic synthesis process needs to be executed again so as to reflect the design change at the function logic level on the gate logic descriptions.

A technique for the automatic logic synthesis at the occurrence of the design change as stated above, has been known from the official gazette of Japanese Patent Application Laid-open No. 72070/1987.

According to this technique, steps for finding out which parts of the logic have changed at the level of gate logic are comprised, and only the changed part is renewed, whereby the design change can be reflected on the gate logic level without losing the additional information of the other part at the gate logic level.

With the prior-art method, however, the logic changed part of the logic is found out in such a way that the gate logic description being a lower-rank or minor description is once synthesized from the function logic description being a higher-rank or major description, and that the description synthesized anew is compared with the current gate logic descriptions over the whole of logic device. Therefore, the method has had the problem that a very long time is expended on the logic change process in the application thereof to large scale object to be-designed.

In addition, as work stations have had their performances enhanced and have come into wide use, a computer environment for aid in the logic design has been turned into a distributed processing system configured of a plurality of processors. Therefore, the prior-art technique has posed the problem that the amount of information items which are transmitted among the processors becomes enormous.

SUMMARY OF THE INVENTION

It is therefore an object of the present invention to provide an automatic logic synthesis system in which the processing time period can be shortened to the utmost by the efficient execution of computer processing required for automatic logic synthesis at the occurrence of a design change, and in which information added at the level of gate logic before the change can be conserved.

In order to accomplish the object, the present invention provides: an automatic logic synthesis system which comprises storage means for storing higher-rank descriptions which define a logic device in terms of expressions of higher abstraction, and lower-rank descriptions which define the logic device in terms of expressions of lower abstraction; and data processing means for originating lower-rank description unit data from the higher-rank description data stored in the storage means, and for storing the synthesized data in the storage means; the storage means including an area for storing first identifiers each of which indicates the presence of a description change of the corresponding higher-rank description unit data, and an area for storing second identifiers each of which indicates the presence of a description change of the corresponding lower rank description unit data.

The data processing means may includes higher-rank description edit means for setting the first identifier of changed description unit data at the change of the higher-rank description, lower-rank description edit means for setting the second identifier of changed description unit at the change of the lower-rank description directly made without any synthesis process from the higher-rank description, and automatic logic synthesis means for originating new lower-rank description unit data from the higher-rank description unit whose first identifier is set, in the automatic logic synthesis after the higher-rank description change, whereupon on condition that the second identifier of the current lower-rank description unit data corresponding to the new lower-rank description unit data is not set, the means registers the new lower-rank description unit data as lower-rank description unit data, and on condition that the second identifier of the current lower-rank description unit data is set, the means merges the new lower-rank description unit data and the current lower-rank description unit data and registers a merged result as lower-rank description unit data.

According to the automatic logic synthesis method of the present invention, the higher-rank description data required for automatically originating the lower rank description can be easily extracted using the first identifiers affixed to the higher-rank description unit. Furthermore, whether the merge process needs to be executed for conserving the changed information of the lower-rank description, or the lower rank description unit may be merely exchanged can be easily judged using the second identifier.

Accordingly, the change of design at the higher-rank description level can be coped with by the least possible processing.

BRIEF DESCRIPTION OF THE DRAWINGS

FIG. 1 is an explanatory diagram showing data organizations in the first embodiment of the present invention;

FIG. 2 is a block diagram showing the architecture of an automatic logic synthesis system according to the first embodiment of the present invention;

FIG. 3 is an explanatory diagram showing the corresponding relations between function logic expressions being higher rank descriptions and gate logic expressions being lower-rank descriptions;

DETAILED DESCRIPTION OF THE PREFERRED EMBODIMENTS

Figure 4:
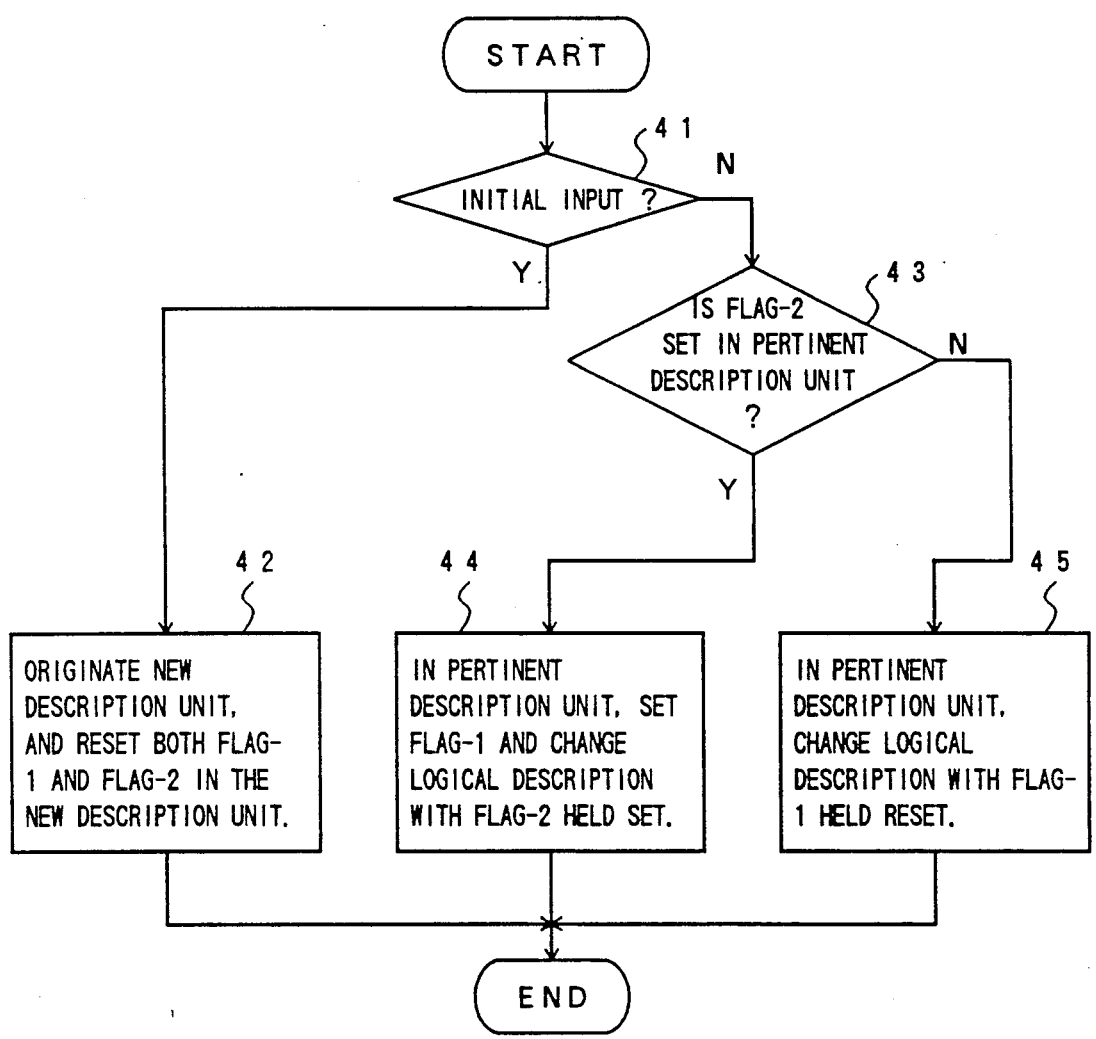
FIG. 4 is a flow chart showing the steps of a function logic edit process.

Now, embodiments of an automatic logic design system according to the present invention will be described.

Embodiment 1

The first embodiment of the automatic logic design system according to the present invention will be described in conjunction with FIGS. 1 thru 6.

FIG. 2 shows the system architecture of the automatic logic design system according to the first embodiment.

As shown in the figure, the automatic logic design system of the first embodiment is so constructed that a terminal 22 as well as a drawing output device 23, and a magnetic storage 24 are connected to a computer 21 which executes file and data edit processes and an automatic logic synthesis process.

The magnetic storage 24 includes therein a function logic file 25 as higher-rank or major descriptions and a gate logic file 26 as lower-rank or minor descriptions.

Here, a function logic expression being the higher-rank description, a gate logic expression being the lower-rank description, and the synthesis of logic will be outlined with reference to FIG. 3.

As shown at a in FIG. 3, a logic designer describes the outer frame of logical functions to be realized by the use of a rectangle 301 as the function logic expression. Within the frame, he/she describes input/output signal names by the use of character strings 302–306, and a module ID which is affixed to a description unit at a function logic level, by the use of a character string 307.

Besides, using an expression 308, the designer describes the logical functions to be realized by the rectangle 301, in terms of a Boolean expression.

When the automatic logic synthesis process is executed by affording such function logic information items as inputs, gate logic as shown at b in FIG. 3 is automatically synthesized.

At b in FIG. 3, symbols 309, 312 and 315 denote gates which realize the function logic shown at a in FIG. 3.

Character strings 310, 313 and 316 designate a module ID which is affixed to every description unit. They indicate that the contents represented by the rectangle 301 in the function logic correspond to the symbols 309, 312 and 315 in the gate logic.

Character strings 311, 314 and 317 designate cell IDs which are affixed to the respective symbols.

Next, the data organizations of the function logic and gate logic files will be described with reference to FIG. 1.

As shown in FIG. 1, the function logic file 25 which is stored in the magnetic storage 24 (refer to FIG. 2) is formed of the columns of module IDs (11), flags-1 (12), flags-2 (13) and logical descriptions (14).

The module ID 11 corresponds to the foregoing one 307 illustrated in FIG. 3.

The flag 1 12 indicates the presence of a change in relation to the pertinent module ID. In the first embodiment, this flag is set in the case where the description unit of the function logic has been changed after the automatic synthesis of the corresponding description unit of the gate logic, and it is held in its reset status in any other case.

The flag-2 13 indicates whether or not a gate logic description exists, in relation to the pertinent module ID. In the first embodiment, this flag is set when the corresponding description unit of the gate logic has been automatically synthesized, and it is reset when the corresponding gate-logic description unit has been erased.

The logical description 14 is an area in which the input/output signal names and the Boolean expression illustrated in FIG. 3, or the likes are stored.

Likewise, the gate logic file 26 which is stored in the magnetic storage 24 (refer to FIG. 2) is formed of the columns of module IDs (15), flags-3 (16), cell IDs (17) and logical descriptions (18).

The module ID 15 is the same as the module ID 11 of the corresponding description unit of the function logic file 25. Thus, the function logic file 25 and the gate logic file 26 are held in correspondence.

The flag-3 16 indicates whether or not the gate logic description unit of the pertinent module ID has been changed after the automatic logic synthesis thereof.

The cell IDs 17 indicate the kinds of cells necessary for realizing logical functions which are to be possessed in module-ID unit. The logical description 18 is an area for storing the cell connection information, or the like.

The operation of the automatic logic synthesis system of the first embodiment will be described below.

First, operating steps in the computer 21 for originating and editing the function logic file 25 by the use of the terminal 22 will be explained with reference to FIG. 4.

Referring to the figure, whether or not the input is an initial one is decided at a step 41. In the case of the initial input, a step 42 resets both the flag-1 and the flag-2 and originates the function logic file 25 in description unit (in module-ID unit).

In a case where the input is not the initial one, a step 43 checks whether or not the flag-2 is set in each description unit. If the flag-2 is set, the corresponding description unit of the gate logic file 26 exists. At a step 44, therefore, the flag-1 is set to indicate the change of design, and the logical description of the function logic file 25 is renewed. On the other hand, if the flag 2 is reset, the logical description of the function logic file 25 is renewed with the flag-1 held in its reset status at a step 45.

Next, steps for erasing and editing the gate logic file 26 by the use of the terminal 22 will be explained with reference to FIG. 5.

Referring to the figure, if an erase process is decided at a step 51, the flag-2 of the corresponding description unit of the function logic file 25 is reset at a step 52, and the pertinent description unit of the gate logic file 26 is erased at a step 53.

On the other hand, in case of an edit process, a step 54 checks the status of the flag-3. If the flag-3 is set, the pertinent description unit has never experienced a change. At a step 55, therefore, the pertinent description unit of the gate logic file 26 is renewed with the flag-3 held in its set status.

Besides, if the flag-3 is reset, the pertinent description unit is currently renewed for the first time. At a step 56, therefore, the flag-3 is set, and the pertinent description unit of the gate logic file 26 is renewed.

Figure 6:
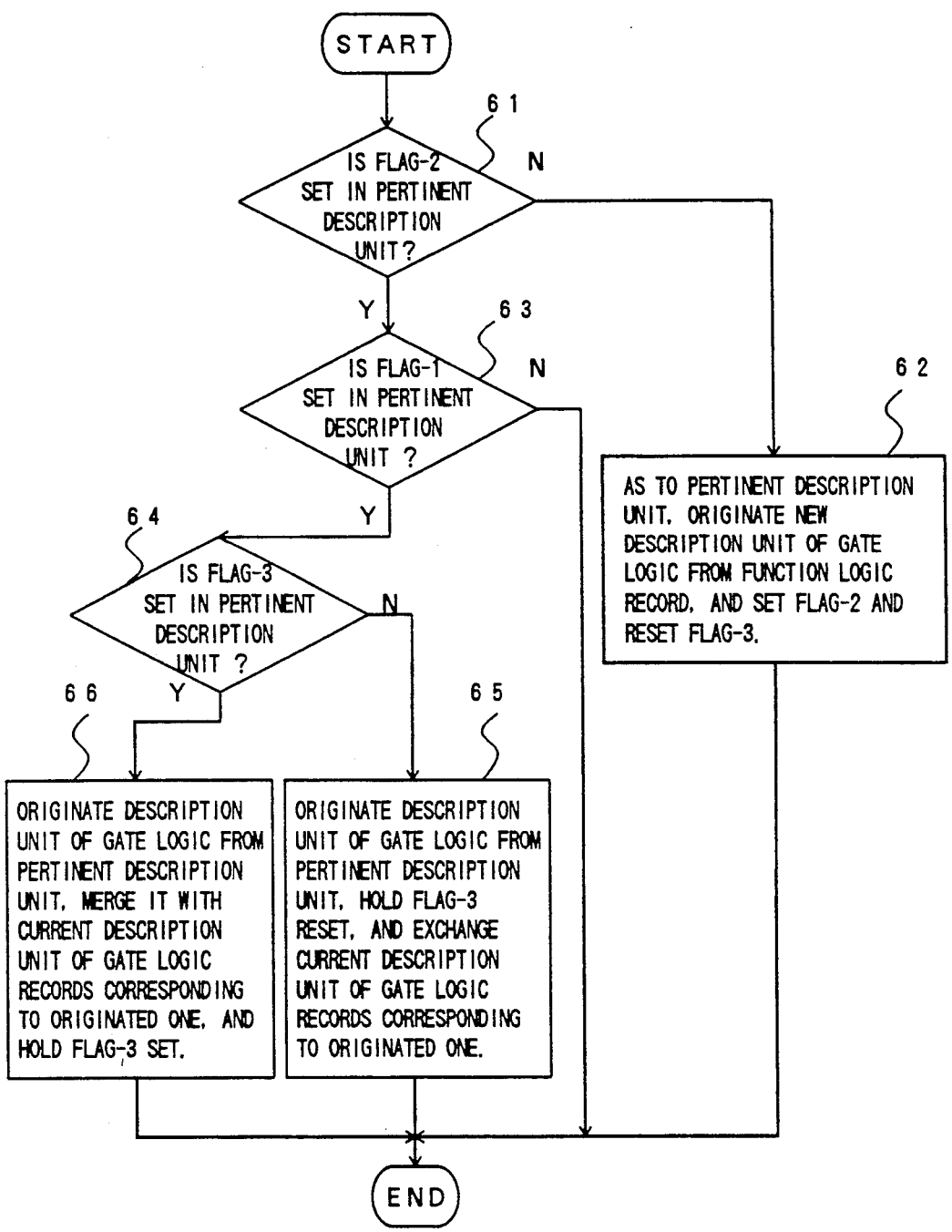
FIG. 6 is a flow chart showing the steps of an automatic logic synthesis process.

Next, steps for originating the gate logic file 26 from the function logic file 25 through the automatic logic synthesis will be explained with reference to FIG. 6.

Also this figure shows a process which is executed every description unit of the function logic file 25. First, if the flag-2 of the pertinent description unit is found reset at a step 61, the corresponding gate-logic description unit does not exist. At a step 62, therefore, the gate-logic description unit is originated. On this occasion, the flag-2 of the function-logic description unit is set, and the flag-3 of the gate logic description unit is reset. On the other hand, if the flag-2 is set, the flag 1 is further checked at a step 63.

If the flag-1 is reset, the function-logic description unit has no points of change, and hence, no processing is required.

On the condition that the flag-1 is set, the flag-3 of the corresponding gate-logic description unit is further checked at a step 64. If the flag-3 is reset herein, it means that the gate logic description unit has experienced no change since the origination thereof. At a step 65, therefore, the new description unit of the gate logic file 26 is originated from the pertinent description unit of the function logic file 25, and it is substituted for the old one. In a case where the flag-3 is set, a step 66 originates new gate logic information and merges it with the old information as to the gate-logic description unit whose flag-3 is set. That is, gate logic information records are exchanged while conserving the change information added to the conservable gate-logic description. More concretely, in this embodiment, whether or not the cell units (17, 18) in the gate logic organization shown in FIG. 1 have ever been changed is judged. The merge is done so that the cell unit having undergone no change may be conserved, and that the cell unit having undergone a change may be substituted, supplemented or deleted. By way of example, the prior art technique mentioned before (disclosed in the official gazette of Japanese Patent Application Laid open No. 72070/1987) can be utilized as a method for the merge.

On this occasion, the flag-3 of the gate-logic description unit is held in its set status.

However, it is also possible to replace the processing of the step 66 with the following:

It is communicated to the operator of the system that the change information added to the gate logic description is not conservable. Thereafter, all the gate-logic description units are substituted by processing similar to that of the step 65.

As set forth above, according to the first embodiment, when the change of design has occurred in the function logic file, the corresponding description unit of the gate logic file can be efficiently changed. Moreover, the information added in the gate logic file can be conserved to the utmost.

Embodiment 2

The second embodiment of the automatic logic synthesis system according to the present invention will be described below.

Figure 7:
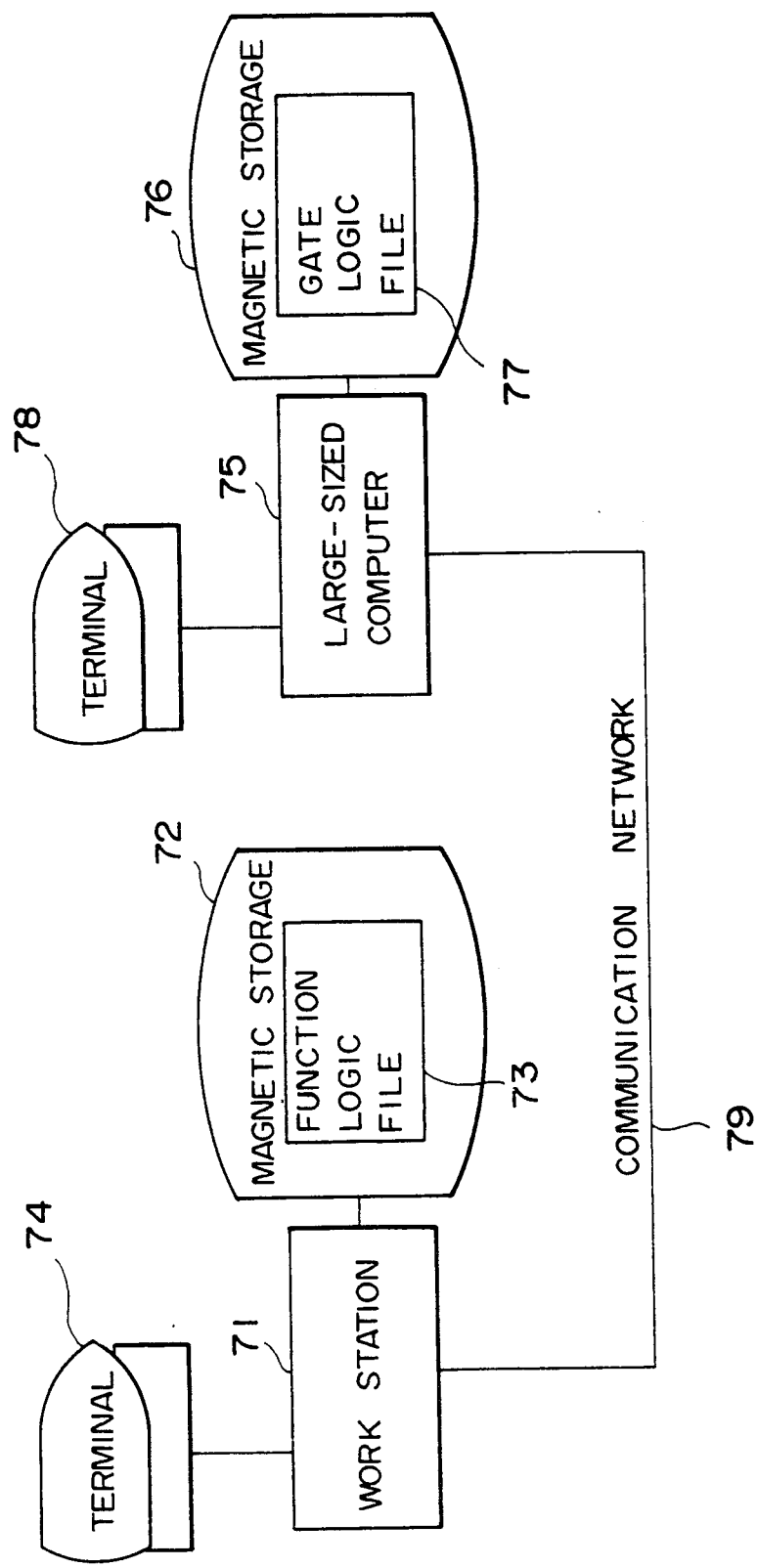
FIG. 7 is a block diagram showing the architecture of an automatic logic synthesis system according to the second embodiment of the present invention.

FIG. 7 shows the architecture of the automatic logic synthesis system according to this embodiment.

As shown in the figure, a work station 71 which executes processes such as editing a function logic file 73 is directly connected to a terminal 74 and a magnetic storage 72 for storing the function logic file 73.

Besides, a large-sized computer 75 which executes processes such as editing a gate logic file 77 is directly connected to a terminal 78 and a magnetic storage 76 for storing the gate logic file 77.

Further, the work station 71 and the large-sized computer 75 are interconnected through a communication network 79.

Here, function logic expressions being higher-rank or major descriptions and gate logic expressions being lower-rank or minor descriptions are the same as those explained in the first embodiment (refer to FIG. 3).

Also, the organizations of the function logic and gate logic files are the same as those explained in the first embodiment (refer to FIG. 1).

Figure 5:
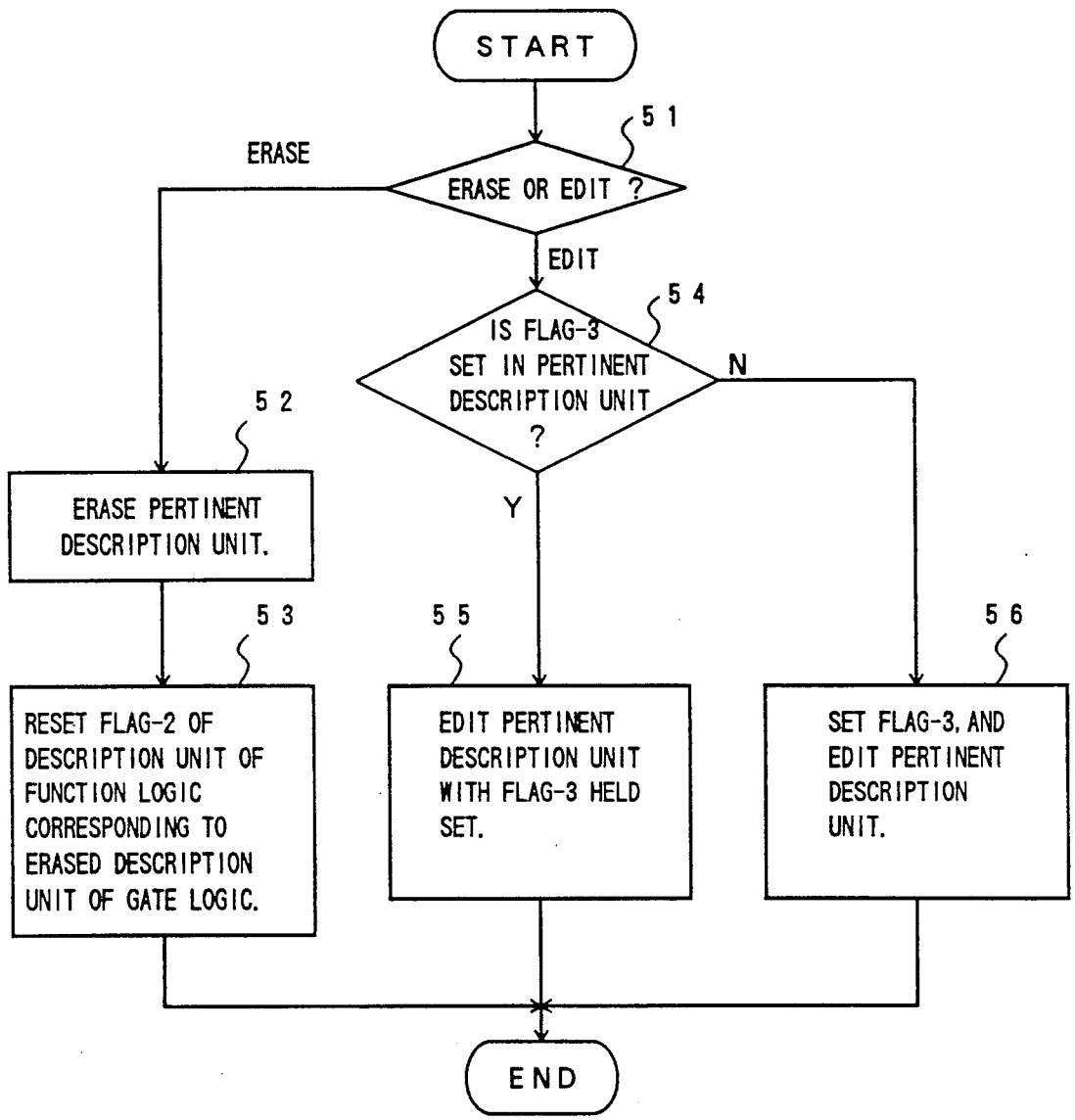
FIG. 5 is a flow chart showing the steps of a gate logic edit process.

In the second embodiment, the originating and editing programs of the function logic file explained with reference to FIG. 4 in the first embodiment are run in the work station 71, and the erasing and editing programs of the gate logic file explained with reference to FIG. 5 are run in the large-sized computer 75.

Next, the operation of the automatic logic synthesis system of the second embodiment will be described.

Figure 8:
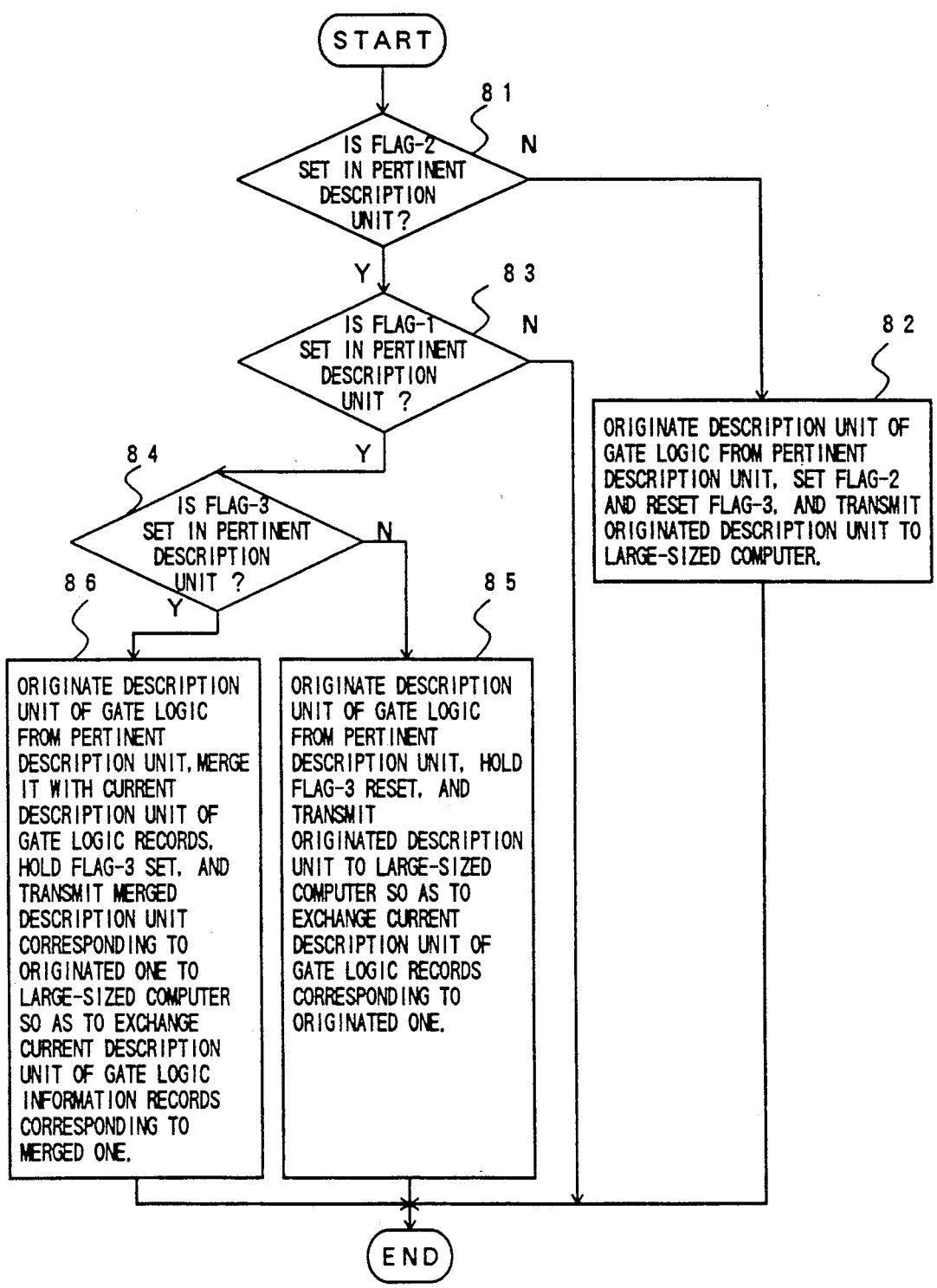
FIG. 8 is a flow chart showing the steps of an automatic logic synthesis process in the second embodiment.

FIG. 8 shows steps for originating the gate logic file 77 from the function logic file 73 through the automatic logic synthesis.

The steps indicate a process which is executed every description unit of the function logic file 73 by the work station 71.

As seen from the figure, if the flag-2 of the pertinent description unit is found reset at a step 81, the corresponding gate-logic description unit does not exist, so that the work station 71 originates the gate-logic description unit and transmits it to the large-sized computer 75 through the communication network 79 at a step 82.

On this occasion, the flag 2 of the functionlogic description unit is set, and the flag-3 of the gate-logic description unit is reset through the communication network 79.

On the other hand, if the flag-2 is set, the flag 1 is further checked at a step 83.

If the flag-1 is reset, the function-logic description unit has no point of change, and hence, no processing is required.

On condition that the flag-1 is set, the flag-3 of the corresponding gate logic description unit is checked through the communication network 79 at a step 84.

If the flag-3 is reset herein, it is meant that the gate-logic description unit has experienced no change since the origination thereof. At a step 85, therefore, the new description unit of the gate logic file 77 is originated from the pertinent description unit of the function logic file 73, and it is transmitted to the magnetic storage 76 through the communication network 79 so as to be substituted for the old one.

In a case where the flag-3 is set, the processing flow proceeds to a step 86. Here, the work station 71 loads the corresponding gate-logic information through the communication network 79, and it merges the new gate-logic information with the old one in the same manner as in the first embodiment. A merged result is transmitted to the large-sized computer 75 through the communication network 79.

On this occasion, the flag-3 of the gate logic description unit is held in its set status.

However, it is also possible to replace the processing of the step 86 with the following as in the first embodiment: It is communicated to the operator of the system that the change information added to the gate logic description is not conservable.

Thereafter, the gate-logic description units are substituted by processing similar to that of the step 85.

By the way, the second embodiment has been explained as to the case where the work station side executes the automatic logic synthesis process, but alternatively the large sized computer side may well execute the same.

In this case, function logic data and gate logic change information which are necessary may be transmitted from the work station 71 to the large-sized computer 75.

Besides, the second embodiment has been explained as to the system in which only the magnetic storage 76 on the large-sized computer side stores the gate logic file 77, but also the magnetic storage 72 on the work station side may well store a gate logic file.

In this case, edit processes for the respective files and the automatic logic synthesis process stated above can be executed by only the work station 71. After any of the processes, the work station 71 may transmit only changed units to the large-sized computer 75 through the communication network 79 so as to substitute them.

Thus, the amount of communication data is further curtailed.

To the contrary, only the magnetic storage 76 on the large-sized computer side may well store a function logic file and the gate logic file 77.

In this case, the work station 71 executes the edit processes while accessing to the corresponding files in the magnetic storage 76 of the large-sized computer side through the communication network 79, and the large-sized computer 75 executes the automatic logic synthesis process.

Thus, only information items for the edit processes may be transmitted through the communication network 79, so that a smaller amount of communication data suffices.

As set forth above, according to the second embodiment, in the environment in which the function logic file and the gate logic file(s) are stored distributively, the amount of information to be transferred through the communication network can be minimized, and the processing can be rendered efficient.

Incidentally, it is desirable for a higher processing speed that, as in each of the foregoing embodiments, the function-logic description units being the higher rank or major descriptions are endowed with the flags-1 indicating the changes thereof and also with the flags-2 indicating the presence of the corresponding gate-logic description units being the lower-rank or minor descriptions. However, in a system in which the endowment with the flags-2 is difficult for any cause, only the flags-1 may well be used.

In this case, all the flags-1 are set when the function logic descriptions are originated in the function-logic edit process (refer to FIG. 4).

Then, in the automatic logic synthesis process (refer to FIG. 6 or FIG. 8), whether or not the corresponding gate-logic description unit exists is searched as regards the function-logic description unit whose flag-1 is set. If the gate-logic description unit exists, the processing of each embodiment in the case where the flag-1 and the flag-2 are set (the processing of the step 64 et seq. in FIG. 6 or the step 84 et seq. in FIG. 8) may be executed. In contrast, if it does not exist, the processing of each embodiment in the case where the flag-2 is not set (the processing of the step 62 et seq. in FIG. 6 or the step 82 et seq. in FIG. 8) may be executed.

As stated above, according to each of the embodiments, owing to the use of the flags, the information items on the change of design can be efficiently managed as to each of the higher-rank descriptions and the lower-rank descriptions in the environment in which the logic device is designed with the aid of the electronic computer.

Therefore, the additional information items afforded to the lower-rank descriptions are not lost, and the content of the design change in the higher-rank descriptions can be automatically synthesized and reflected on the lower rank descriptions at a high efficiency.

These facts are greatly effective especially in designing a logic device of large scale.

Moreover, according to the automatic logic synthesis system of the present invention, in the distributed processing environment in which a plurality of processors are used, the automatic logic synthesis is permitted to transfer only the information items of necessary change parts among the processors, so that the automatic synthesis process can be efficiently executed.

As described above, according to the present invention, it is possible to provide an automatic logic synthesis system in which a processing time period can be shortened to the utmost by the efficient execution of computer processing required for automatic logic synthesis at the occurrence of a design change, and in which information added at the level of gate logic before the change can be conserved.

Moreover, according to the present invention, the amount of information items to be transmitted among processors can be reduced to the utmost in a case where the automatic logic synthesis system is realized in a distributed processing environment.

What is claimed is:

1. A method for logic change in an automatic logic synthesis system, wherein said automatic logic synthesis method synthesizes lower-rank descriptions defining a logic device in terms of expressions of lower abstraction from higher-rank descriptions defining the logic device in terms of expressions of higher abstraction, said logic change method comprising:

providing first identifiers each of which indicates the presence of a description change of the corresponding description unit data of the higher-rank description, and providing second identifiers each of which indicates the presence of a description change of the corresponding description unit data of the lower-rank description;

setting the first identifier of changed description unit data at the change of the higher-rank description, and setting the second identifier of changed description unit at the change of the lower-rank description directly made without any synthesis process from the higher-rank description;

originating new lower-rank description unit data from the higher-rank description unit whose first identifier is set, in the automatic logic synthesis after the higher-rank description change; and registering the new lower-rank description unit data as lower-rank description unit data on condition that the second identifier of the current lower-rank description unit data corresponding to the new lower-rank description unit data is not set, and merging the new lower-rank description unit data and the current lower-rank description unit data and then registering a merged result as lower-rank description unit data on condition that the second identifier of the current lower-rank description unit data is set.

2. The method for logic change in an automatic logic synthesis system as defined in claim 1, further comprising:
providing third identifiers each of which indicates whether or not a lower-rank description corresponding to the description unit data of the higher-rank description exists;
setting the third identifier of the higher-rank description unit from which the lower-rank description has been synthesized, at the origination; and
originating and registering lower-rank description unit data anew as to the higher-rank description unit whose third identifier is not set, in the automatic logic synthesis.

3. A system for logic change in an automatic logic synthesis system, said automatic logic synthesis system comprising:
storage means for storing higher-rank descriptions, which define a logic device in terms of expressions of higher abstraction, and for storing lower-rank descriptions, which define the logic device in terms of expressions of lower abstraction; and
data processing means including the automatic logic synthesis means for synthesizing from higher-rank description data stored in said storage means, lower-rank description unit data and for storing said synthesized data in said storage means;
said storage means including:
an area for storing first identifiers each of which indicates the presence of a description change of the corresponding higher-rank description unit data, and an area for storing second-identifiers each of which indicates the presence of a description change of the corresponding lower rank description unit data;
said data processing means including:
higher-rank description edit means for setting the first identifier of changed description unit data at the change of the higher-rank description,
lower-rank description edit means for setting the second identifier of changed description unit at the change of the lower-rank description directly made without any synthesis process from the higher-rank description, and
automatic logic synthesis means for originating new lower-rank description unit data from the higher-rank description unit whose first identifier is set, in the automatic logic synthesis after the higher-rank description change, whereupon on condition that the second identifier of the current lower-rank description unit data corresponding to the new lower-rank description unit data is not set, said means registers the new lower-rank description unit data as lower-rank description unit data, and on condition that the second identifier of the current lower-rank description unit data is set, said means merges the new lower-rank description unit data and the current lower-rank description unit data and registers a merged result as lower-rank description unit data.

4. The system for logic change in an automatic logic synthesis system as defined in claim 3, wherein:
said storage means includes an area for storing third identifiers each of which indicates whether or not a lower-rank description of the corresponding higher-rank description unit data exists; and
said data processing means originates and registers lower-rank description unit data anew as to the higher rank description unit whose third identifier is not set, and it sets the third identifier of the higher-rank description unit, in the automatic logic synthesis.

5. The system for logic change in an automatic logic synthesis system as defined in claim 4, further comprising:
a first automatic logic synthesis terminal including a first storage and a first data processor,
a second automatic logic synthesis terminal including a second storage and a second data processor, and
a communication line which connects said first automatic logic synthesis terminal and said second automatic logic synthesis terminal;
said first storage including an area for storing the higher-rank descriptions, the first identifiers each of which indicates the presence of the description change of the corresponding higher-rank description unit data, and the third identifiers each of which indicates whether or not the lower-rank description of the corresponding higher-rank description unit data exists;
said second storage including an area for storing the lower-rank descriptions, and the second identifiers each of which indicates the presence of the description change of the corresponding lower rank description unit data;
said first data processor including:
access means for accessing to the lower-rank description data stored in said second storage, through said communication line,
the higher-rank description edit means for setting the first identifier of the changed higher-rank description unit data at the change of the higher rank description,
the lower-rank description edit means for setting the second identifier of the changed description unit stored in said second storage, at the change of the lower-rank description directly made without any synthesis process from the higher-rank description, and
the automatic logic synthesis means for originating the lower-rank description unit data anew as regards the higher-rank description unit whose third identifier is not set, so as to register the synthesized data in said second storage, and for setting the third identifier of the higher-rank description unit, and for originating the new lower-rank description unit data as regards the higher-rank description unit whose third identifier is set and whose first identifier is set, whereupon on condition that the second identifier of the current lower-rank description unit data corresponding to the new lower-rank description unit data is not set, said means registers the new lower-rank description unit data in said second storage as lower rank description unit data, and on condition that the second identifier of the current lower-rank description unit data is set, said means merges the new lower-rank description unit data and the current lower-rank description unit data and registers a merged result in said second storage as lower rank description unit data;

said storage means being constructed of said first storage and said second storage, while said data processing means is constructed of said first data processor.

6. The system for logic change in an automatic logic synthesis system as defined in claim 4, further comprising:

a first automatic logic synthesis terminal including a first storage and a first data processor, at least one second automatic logic synthesis terminal including a second storage and a second data processor, and at least one communication line which connects said first automatic logic synthesis terminal and said second at least one automatic logic synthesis terminal;

said first storage including an area for storing the higher-rank descriptions, the first identifiers each of which indicates the presence of the description change of the corresponding higher-rank description unit data, and the third identifiers each of which indicates whether or not the lower-rank description of the corresponding higher-rank description unit data exists;

said second storage including an area for storing the lower-rank descriptions, and the second identifiers each of which indicates the presence of the description change of the corresponding lower-rank description unit data;

said first data processor including access means for accessing to the lower-rank description data stored in said second storage, through said communication line, the higher-rank description edit means for setting the first identifier of the changed description unit data at the change of the higher-rank description, the lower-rank description edit means for setting the second identifier of the changed description unit stored in said second storage, at the change of the lower-rank description directly made without any synthesis process from the higher-rank description, and means for transmitting the higher-rank description unit whose third identifier is not set and the higher-rank description unit whose first identifier is set, to said second data processor at the automatic logic synthesis;

said second data processor including the automatic logic synthesis means for originating and registering the lower-rank description unit data anew as to the higher-rank description unit which is transmitted from said first data processor and whose third identifier is not set, and for setting the third identifier of the higher-rank description unit stored in said first storage, in the automatic logic synthesis, and for originating the new lower-rank description unit data as regards the higher-rank description unit whose third identifier is set and whose first identifier is set, whereupon on condition that the second identifier of the current lower-rank description unit data corresponding to the new lower-rank description unit data is not set, said means registers the new lower-rank description unit data as lower-rank description unit data, and on condition that the second identifier of the current lower-rank description unit data is set, said means merges the new lower-rank description unit data and the current lower-rank description unit data and registers a merged result as lower-rank description unit data;

said storage means being constructed of said first storage and said second storage, while said data processing means is constructed of said first data processor and said second data processor.

* * * * *